United States Patent
Rathsack et al.

(10) Patent No.: US 9,633,847 B2
(45) Date of Patent: Apr. 25, 2017

(54) USING SUB-RESOLUTION OPENINGS TO AID IN IMAGE REVERSAL, DIRECTED SELF-ASSEMBLY, AND SELECTIVE DEPOSITION

(71) Applicant: Tokyo Electron Limited, Tokyo (JP)

(72) Inventors: Benjamen M. Rathsack, Austin, TX (US); Mark H. Somervell, Austin, TX (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 15/093,218

(22) Filed: Apr. 7, 2016

(65) Prior Publication Data

US 2016/0300711 A1    Oct. 13, 2016

Related U.S. Application Data

(60) Provisional application No. 62/145,683, filed on Apr. 10, 2015.

(51) Int. Cl.
| | |
|---|---|
| H01L 21/027 | (2006.01) |
| H01L 21/3105 | (2006.01) |
| H01L 21/311 | (2006.01) |
| H01L 21/3213 | (2006.01) |

(52) U.S. Cl.
CPC .... H01L 21/0273 (2013.01); H01L 21/31058 (2013.01); H01L 21/31144 (2013.01); H01L 21/32139 (2013.01)

(58) Field of Classification Search
CPC .......................... H01L 21/0274; H01L 21/0338
See application file for complete search history.

(56) References Cited

U.S. PATENT DOCUMENTS

| | | | | |
|---|---|---|---|---|
| 2004/0087164 A1* | 5/2004 | Bao | ............. | H01L 21/76808 438/694 |
| 2011/0248315 A1* | 10/2011 | Nam | ............. | B82Y 10/00 257/184 |
| 2012/0097229 A1* | 4/2012 | Aoki | ............. | B82Y 30/00 136/255 |
| 2013/0189627 A1* | 7/2013 | Yamamoto | ............. | C08K 5/04 430/313 |

* cited by examiner

*Primary Examiner* — Duy Deo
(74) *Attorney, Agent, or Firm* — Wood Herron & Evans LLP (57) ABSTRACT

A method for treating a microelectronic substrate to form a chemical template includes patterning the substrate to form a trench structure with a plurality of trenches of a defined trench width and depositing a photoactive material on the substrate to overfill the trench structure to form a fill portion in the plurality of trenches and an overfill portion above the trench structure. The method further includes exposing the photoactive material to electromagnetic radiation comprising a wavelength that is at least four times greater than the defined trench width such that the overfill portion is modified by the exposure while the electromagnetic radiation fails to penetrate into the plurality of trenches leaving the fill portion unmodified and removing the modified overfill portion of the photoactive material to form a planarized filled trench structure for use as a chemical template for selective reactive ion etching, selective deposition, or directed self-assembly.

26 Claims, 7 Drawing Sheets

USING SUB-RESOLUTION OPENINGS TO AID IN IMAGE REVERSAL, DIRECTED SELF-ASSEMBLY, AND SELECTIVE DEPOSITION

FIELD OF THE INVENTION

This invention relates to an apparatus and method for using sub-resolution openings to aid in image reversal, directed self-assembly, and selective deposition.

BACKGROUND OF THE INVENTION

The need to remain competitive in cost and performance in the production of semiconductor devices elevates demand to continually increase the device density of integrated circuits. To achieve higher degrees of integration with the miniaturization in semiconductor integrated circuitry, robust methodologies are required to reduce the scale of the circuit pattern formed on the semiconductor substrate. These trends and requirements impose ever-increasing challenges on the ability to prepare electrical structure isolation during circuit pattern fabrication.

Photolithography is a mainstay technique used to manufacture semiconductor integrated circuitry by transferring geometric shapes and patterns on a mask to the surface of a semiconductor wafer. In principle, a light sensitive material is exposed to patterned light to alter its solubility in a developing solution. Once imaged and developed, the portion of the light sensitive material that is soluble in the developing chemistry is removed, and the circuit pattern remains. Furthermore, to advance optical lithography, as well as accommodate the deficiencies thereof, continual strides are being made to establish alternative patterning strategies to equip the semiconductor manufacturing industry for sub-30 nm technology nodes.

In concert with advanced patterning techniques, advanced, highly selective etching techniques are required to transfer sub-30 nm features. Additionally, advanced etching schemes are challenged to meet requirements for profile control, anisotropy, and rate, among other things.

SUMMARY OF THE INVENTION

The present invention provides a method for treating a microelectronic substrate to form a chemical template. The method includes patterning the substrate to form a trench structure with a plurality of trenches of a defined trench width and depositing a photoactive material on the substrate to overfill the trench structure to form a fill portion in the plurality of trenches and an overfill portion above the trench structure. The method further includes exposing the photoactive material to electromagnetic radiation comprising a wavelength that is at least four times greater than the defined trench width such that the overfill portion is modified by the exposure while the electromagnetic radiation fails to penetrate into the plurality of trenches leaving the fill portion unmodified. The method further includes removing the modified overfill portion of the photoactive material to form a planarized filled trench structure for use as a chemical template for selective reactive ion etching, selective deposition, or directed self-assembly.

The present invention provides another method for treating a microelectronic substrate to form a chemical template. The method includes patterning the substrate to form a trench structure with a plurality of trenches of a defined trench width and depositing a photoactive material on the substrate to overfill the trench structure to form a fill portion in the plurality of trenches and an overfill portion above the trench structure. The method further includes exposing the photoactive material to electromagnetic radiation comprising a wavelength that is at least four times greater than the defined trench width such that the overfill portion is modified by the exposure while the electromagnetic radiation fails to penetrate into the plurality of trenches leaving the fill portion unmodified and removing the modified overfill portion of the photoactive material to form a planarized filled trench structure. Further, the method includes coating the planarized filled trench structure with an acid, diffusing the acid into the fill portion to form a deprotected layer on the fill portion of the photoactive material, and incorporating metallic or semi-metallic atoms into the deprotected layer to form a chemical template for selective reactive ion etching, selective deposition, or directed self-assembly.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1A:
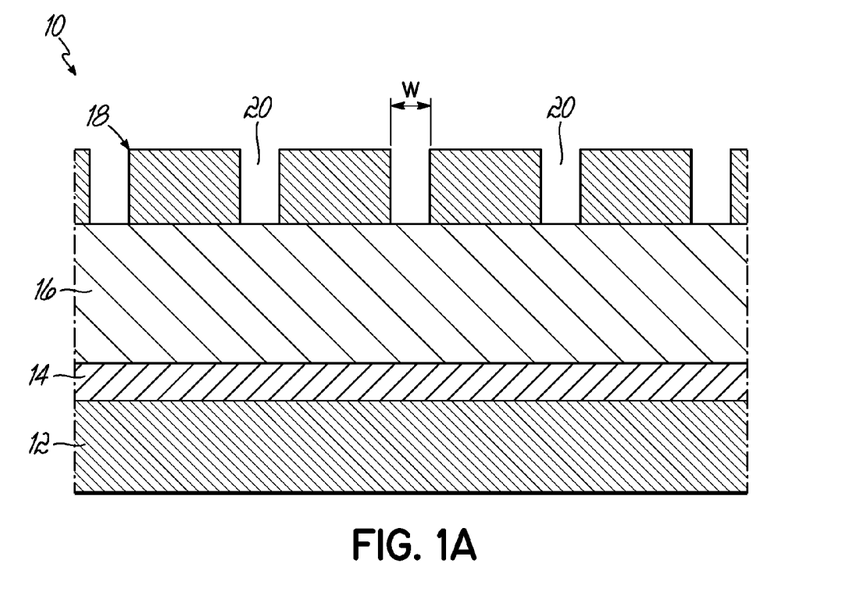
FIGS. 1A-1D are diagrammatic illustrations depicting a method according to an embodiment for forming a chemical template.

Embodiments of the invention are generally directed to methods of treating a microelectronic substrate to form a chemical template. The chemical template may be used for image reversal of a starting pattern, such as a trench pattern, chemo-epitaxy directed self-assembly (DSA), and selective deposition, such as the selective growth of a material layer. Referring generally to FIGS. 1A-1D and FIG. 6, in an embodiment of the invention, a method for creating a chemical template for further processing of a trench pattern is shown. FIG. 1A shows a microelectronic substrate 10 that includes a first layer 12, a second layer 14, and a third layer 16. By way of example and not limitation, the first layer 12 may be a silicon wafer and the second layer 14 may be a native oxide layer. Exemplary materials for the third layer 16 are discussed further below. In 40, a trench structure 18 is patterned onto the microelectronic substrate 10 and defines a series of trenches 20 that are separated by a width W. By way of example and not limitation, the trench structure 18 depicted was formed with a 3:1 duty cycle, referring to the width of the trench structure 18 between the trenches 20 being 3× the trench width W.

Figure 1B:
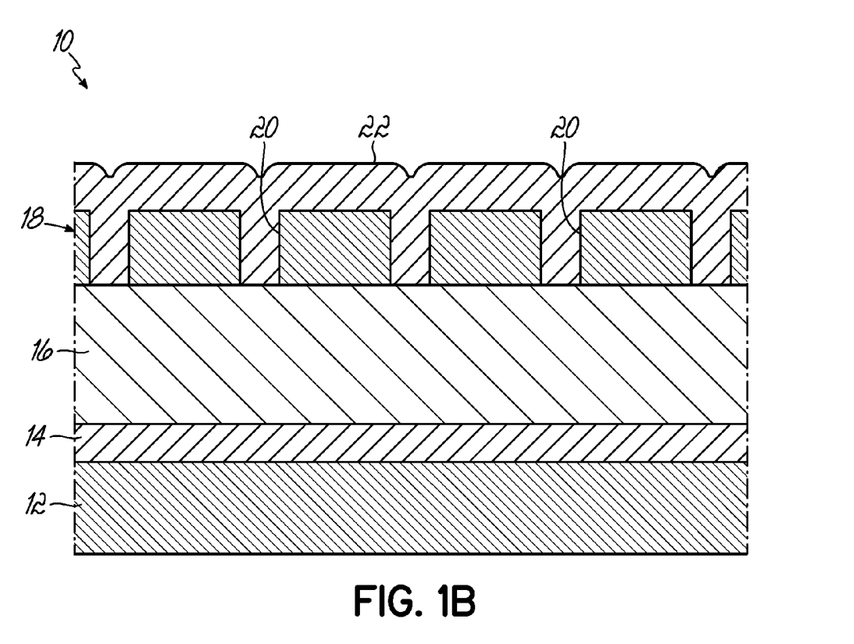

In 42, and as shown in FIG. 1B, the trenches 20 are overfilled with a filling material to form a photoactive film 22. The organic filling material for the photoactive film 22 can be tailored so that it has different optical properties from the material of the trench structure 18. For example, the photoactive film 22 can be tailored to have a different index of refraction (n) for a given wavelength and a different absorbance (k) for the given wavelength. When this occurs, light of the given wavelength cannot appreciably penetrate within the trenches 20 and instead only exposes the portion of the photoactive film 22 that is above the trench structure 18. The filling material for the photoactive film 22 contains a dissolution switching mechanism that allows for the overfilled portion of the photoactive film 22 to be treated and then removed through a wet development process (described below). For example, untreated filling material is not dissolvable by wet developing with a given chemistry while treated filling material switches to being dissolvable in the given chemistry.

Figure 1C:
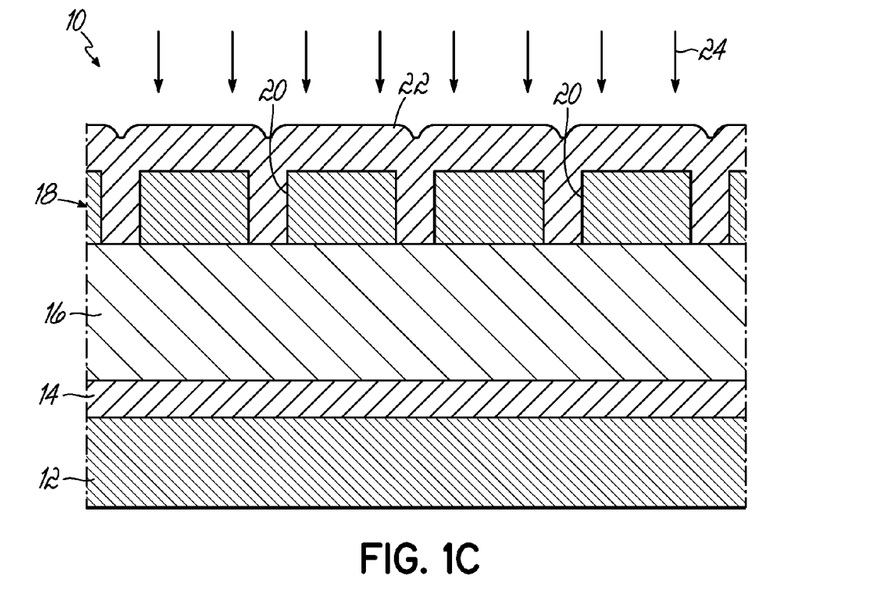
Figure 1D:
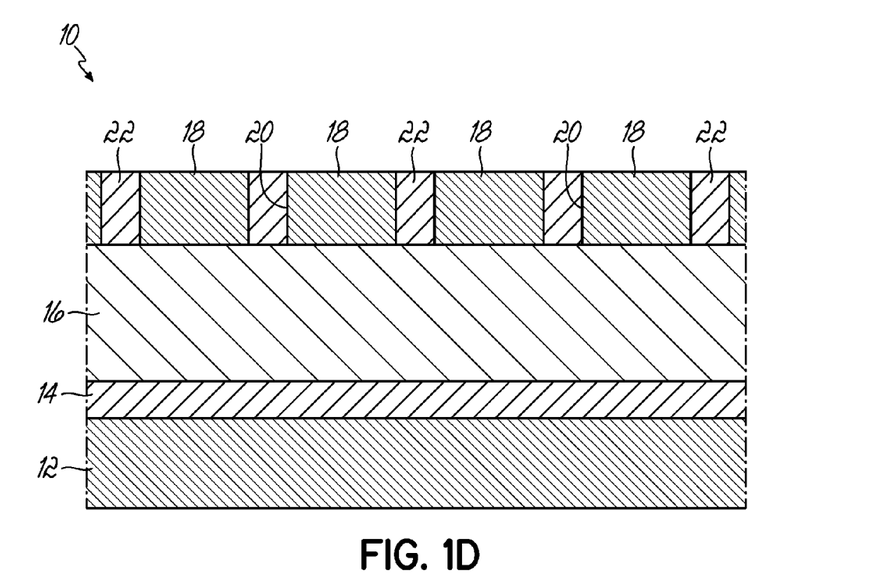
Figure 6:
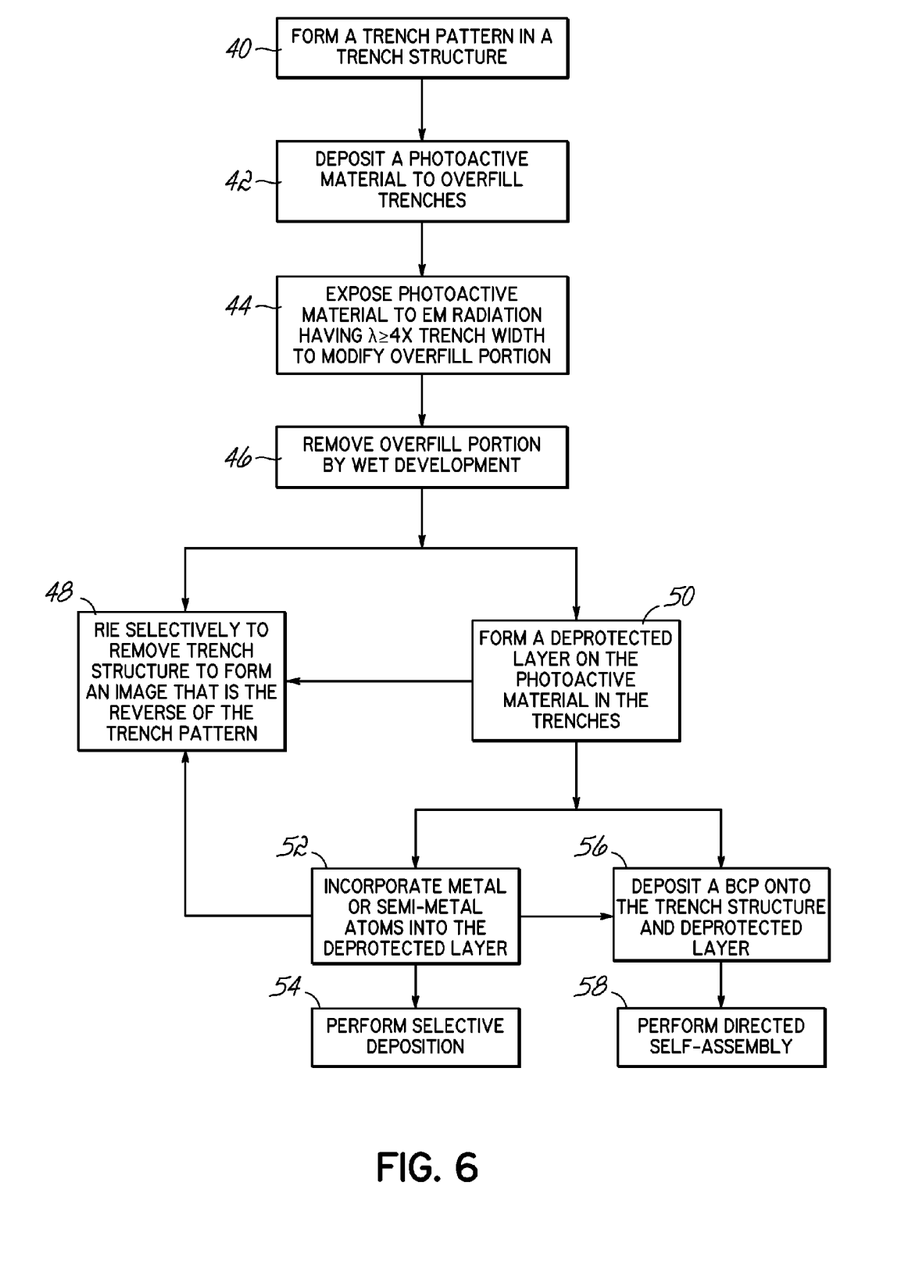
FIG. 6 is a flow chart depicting embodiments for forming and using a chemical template.

Referring now to FIGS. 1C, 1D, and 6, in 44, the overfilled material of the photoactive film 22 is treated and, in 46, is removed. In 44, the photoactive film 22 is exposed to a flood exposure of electromagnetic radiation with a wavelength of light 24 that is greater than four times the width W of the trenches 20, as shown in FIG. 1C. In one instance where the optical properties have been tailored to be different, light of wavelength λ cannot penetrate openings that are less than ¼ of λ. Accordingly, when a properly sized trench or pattern of trenches are filled or overfilled with a photoactive material that is optically different than the material of the trench structure 18, the portion of the photoactive materials within the trench may not be chemically altered by the exposure of light, e.g., may not be rendered dissolvable in the given wet developing chemistry. However, the photoactive material outside or over the trench may be chemically altered as a result of the light exposure, e.g., may be rendered dissolvable in the given wet developing chemistry. In this way, a portion of the photoactive material may be selectively altered, such that the altered and unaltered portions may respond in different ways to subsequent processing. Therefore, the light sensitive photoactive film 22 in the trenches 20 may not be impacted or have a reduced impact when the substrate 10 is exposed to light 24. Thus, the photoacid that is in the unaltered portion of the photoactive film 22 within the trenches 20 is not exposed to the flood exposure shown in FIG. 1C, and so the material within the trenches 20 remains non-acidic after the exposure. In other words, the unaltered portion of the film 22 inside the trenches 20 (i.e., the fill portion) may retain the properties of an unexposed photoactive material, while the altered portion of the film 22 outside of the trenches 20 (i.e., the overfill portion) may have the properties of an exposed photoactive material. In 46, and as shown in FIG. 1D, a wet development process may then be performed to remove the altered overfill portion of the photoactive film 22 that was exposed to the flood exposure.

Following this process sequence for forming a chemical template eliminates potential issues that arise from non-uniformity of the photoactive film 22. Considering an array that consists of trenches of the same size as those shown in FIG. 1A, but on a 5:1 duty cycle (not shown), the photoactive film 22 will overfill these trenches more than the denser trenches 20 shown in FIG. 1A. The flood exposure, then, allows the film heights across the different trench densities to be equalized or planarized. The trenches 20 act to filter the light so that adequate exposure can be used to remove the excess film from the less dense array of trenches without impacting the more dense trenches. When the overfilled portion of the photoactive film 22 is removed, the photoactive film 22 may be discontinuous throughout the trench structure 18. Further, the trench structure 18 and the photoactive film 22 may form a continuous surface, as depicted in FIG. 1D, also referred to as a planarized surface.

Figure 2:
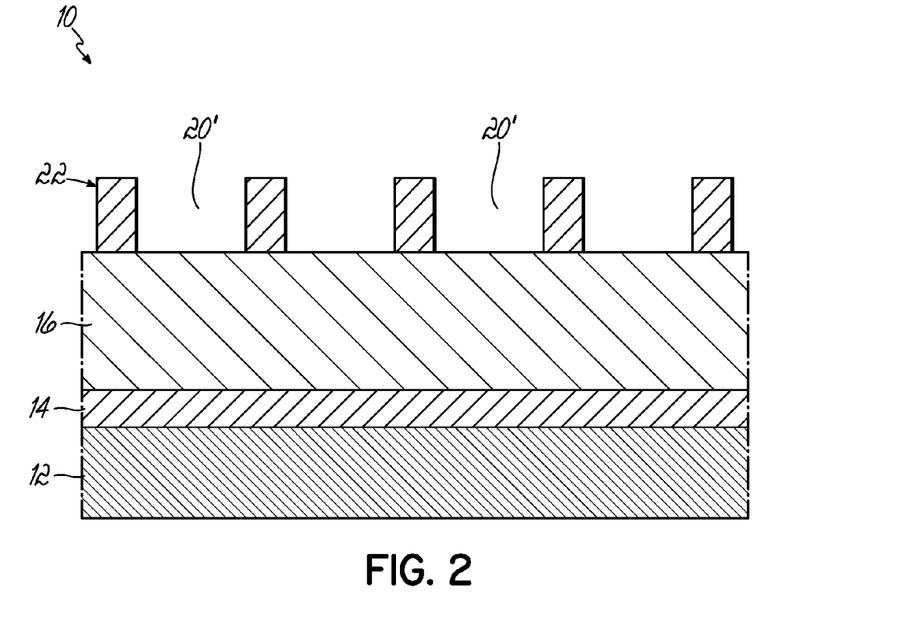
FIG. 2 is a diagrammatic illustration depicting a substrate after image reversal of a trench pattern using the chemical template of FIG. 1D.

The trench structure 18 creates an image that may be reversed according to one embodiment of a method of the invention. With reference to FIGS. 2 and 6, in 48, and using the chemical template of FIG. 1D, the substrate 10 is selectively etched to remove the trench structure 18. Once the trench structure 18 is removed, the photoactive film 22 defines a series of trenches 20' having a 1:3 duty cycle. The trenches 20' define an image that is the reverse of the image defined by the trenches 20 in FIG. 1A. In an embodiment where the material for the trench structure 18 consists of oxide, for example, the organic material used for the photoactive film 22 may have sufficient etch selectivity with certain chemistries that the image reversal can be completed without further modification of the chemical template. For example, reactive ion etching (RIE) may be used to selectively remove the trench structure 18. Etch chemistry and process conditions may be identified by persons having ordinary skill in the art depending on the particular oxide and organic material used. The pattern formed by the photoactive film 22 may be transferred to the underlying layers (transfer process not shown), in which the photoactive film 22 acts as a mask. The compositions of the layers 12, 14, 16 may be identified by persons having ordinary skill in the art depending on the particular application. For example, the underlying layers may have etch selectivity to the material of the photoactive film 22. In an embodiment where the photoactive film 22 is organic, the third layer 16 may be made of an inorganic material, such as SiN.

Figure 3A:
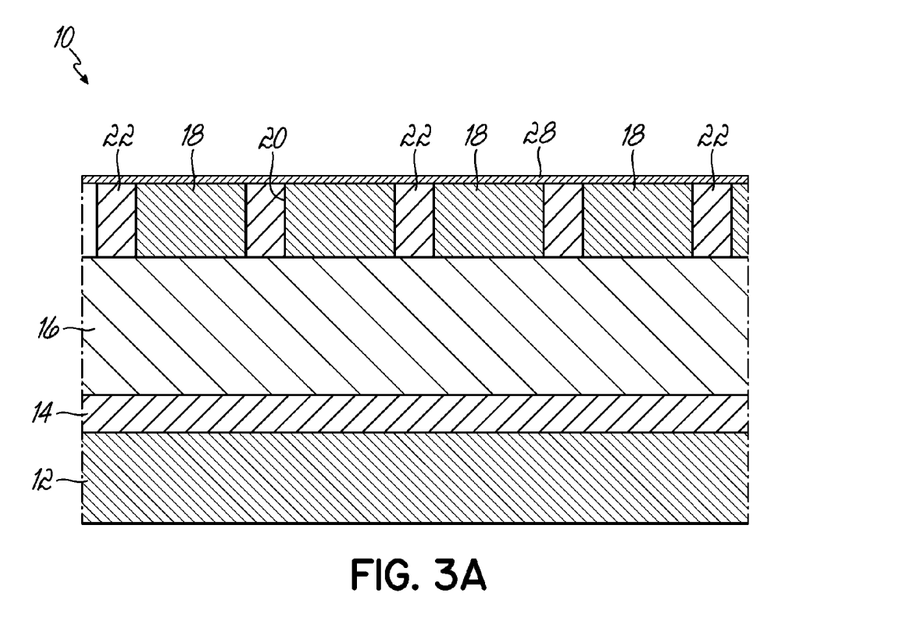
FIGS. 3A and 3B are diagrammatic illustrations depicting a method according to an embodiment for forming a chemical template having a deprotected layer.
Figure 3B:
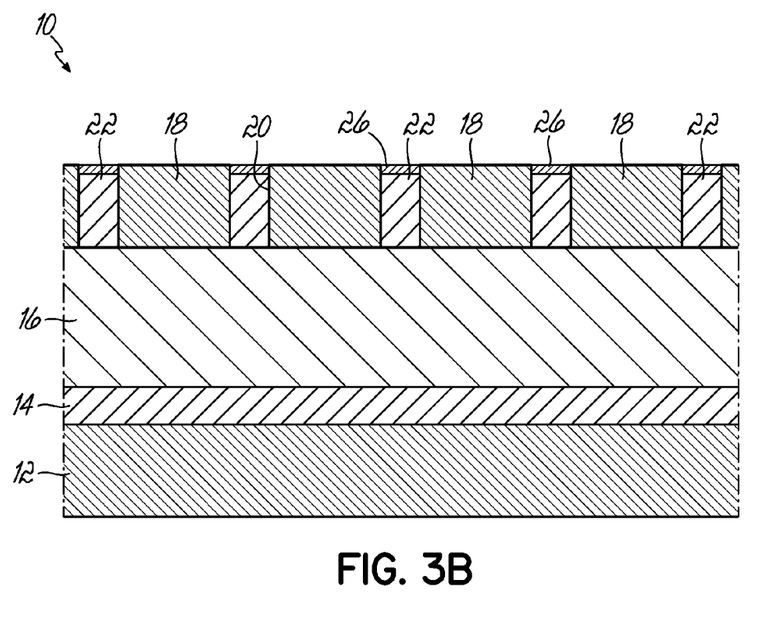

Referring generally now to FIGS. 3A, 3B, and 6, in an embodiment of the invention, a method for further forming a chemical template for image reversal of a starting pattern, directed self-assembly, or selective deposition is shown. The method of this embodiment begins with the substrate 10 having undergone a process, such as that shown in FIGS. 1A-1D, to form a chemical template on the substrate 10. Like reference numerals in FIGS. 3A and 3B are used to refer to like parts in FIGS. 1A-1D. In 50, and with reference to FIGS. 3A and 3B, a deprotected layer 26 is then formed in the photoactive film 22 to provide a modified chemical template having a difference in the surface chemistry that may serve as the basis for selective etching or deposition or for directed self-assembly. For example, to form the deprotected layer 26, and as shown in FIG. 3A, the substrate 10 is treated with an acid rinse that imparts acid 28 onto the top of the photoactive film 22. This is followed by a diffusion bake shown in FIG. 3B that drives the acid 28 down into the photoactive film 22 and creates the deprotected layer 26. The length of time of this diffusion determines how deep the deprotection occurs (i.e., determines the thickness of the deprotected layer 26). One of ordinary skill in the art will recognize that the length of time and the temperature of the diffusion bake will vary based on the materials and the intended application. For example, the temperature of the bake may range from about 70-200° C., and the bake may last for about 10 minutes or less. In an embodiment, a relatively small amount of diffusion and deprotection occurs. For example, the thickness of the deprotected layer 26 may be between 5 nm and 15 nm or may be about 10 nm. Where the original materials of the trench structure 18 and the photoactive film 22 do not provide sufficiently different surface chemistries for the chemical template in FIG. 1D, the modified chemical template in FIG. 3B in which the photoactive film 22 has a surface deprotected layer 26 may provide the necessary surface chemistry to achieve selective etching for image reversal, selective deposition, or directed self-assembly of a block copolymer.

Figure 4A:
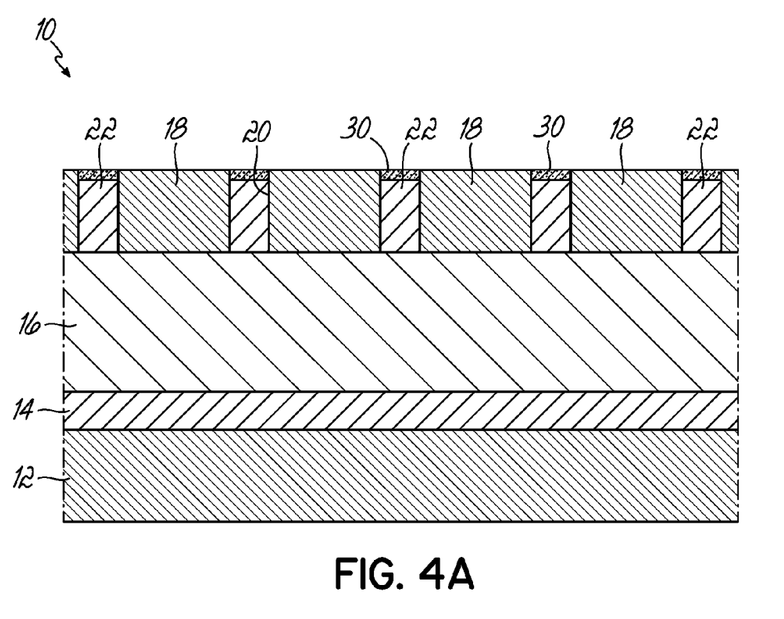
FIG. 4A is a diagrammatic illustration depicting a chemical template having a deprotected layer containing metallic or semi-metallic atoms.

Referring now to FIGS. 4A and 6, in another embodiment, the method shown in FIGS. 3A and 3B may further include, in 52, incorporating metallic or semi-metallic atoms into the deprotected layer 26 to even further modify the chemical template to create desired differences in the surface chemistry, for example, to improve the etch selectivity. In an embodiment, a silylation process is used to incorporate silicon atoms into the deprotected layer 26 to form a modified layer 30. The silylation reaction requires the deprotected layer 26 to have a suitable functionality that will undergo silylation. In various embodiments, the filling material used for the photoactive film 22 may include an aliphatic alcohol, a phenol, or a hexafluoroisopropanol functional group within the polymer chain. The phenolic group in poly(hydroxystyrene) (PHOST) has a suitable chemical reactivity for silylation within a reasonable time and at a relatively low temperature. It is of moderate acidity for an organic functionality (e.g., pKa=9). Aliphatic alcohols can be silylated (e.g., pKa=12), but may take relatively longer to do so. Carboxylic acids, for example, are difficult to silylate because their increased acidity (e.g., pKa=5) forces the silylation reaction equilibrium to lie on the side of the unsilylated state. Accordingly, those skilled in the art will recognize that the pKa of the component that will undergo silylation in the filling material may vary. An exemplary range of the pKa is from about 7-10. Alcohols that have two trifluorogroups attached to the same carbon are readily silylatable as well at low temperatures and times because they have a pKa similar to phenol. It should be recognized that the filling material for the photoactive film 22 may include another suitable functionality for silylation. Any of a number of silylating agents may be useful. These compounds are typically secondary or tertiary amines that contain silicon in the side groups pendant to the amine. For example, typical silylating agents include hexamethyldisilazane (HMDS), trimethylsilyldimethylamine (TMSDMA), dimethylsilyldimethylamine (DMSDMA) and dimethyldisilyldimethylamine (DMDSDMA). Although silylating agents are typically administered in the gas phase, liquid silylating agents may also be used, such as those made popular by the Chemical Amplification of Resist Lines (CARL) Process. An exemplary liquid silylating agent is bisaminopropyloligodimethylsiloxane.

Still referring to FIG. 4A, in another embodiment, metallic atoms may be incorporated into the deprotected layer 26 using aluminum sequential infiltration synthesis (SIS) to form the modified layer 30. Because carbonyl functionalities can undergo aluminum sequential infiltration synthesis (SIS), a variety of acrylic and methacrylic polymers can be used in the filling material. The SIS process is self-propagating. Accordingly, subsequent cycles of the SIS processing lead to subsequent incorporation of aluminum into the deprotected layer 26, which in turn can lead to greater differentiation in surface chemistry, for example, for better etch selectivity for future processing.

Figure 4B:
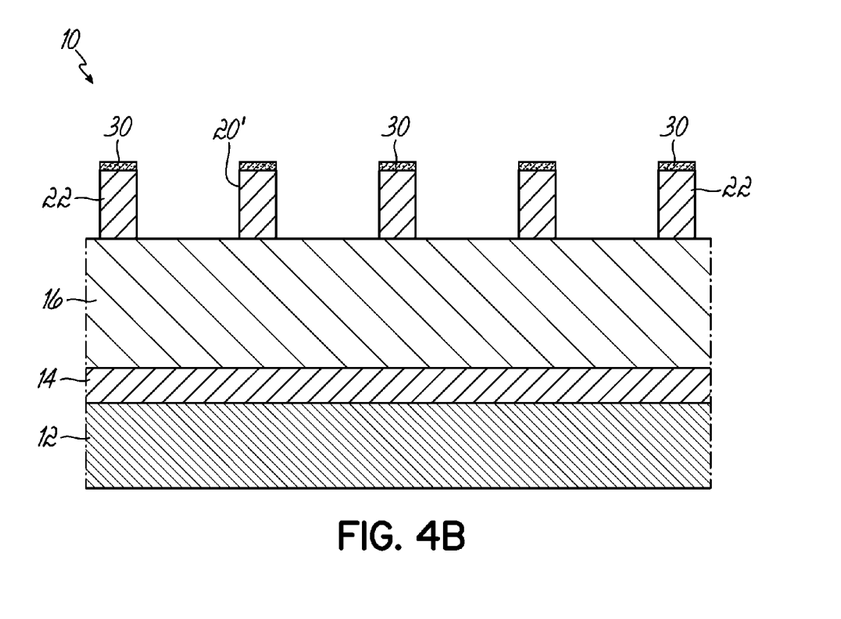
FIG. 4B is a diagrammatic illustration depicting a substrate after image reversal of a trench pattern using the chemical template of FIG. 4A.

Referring now to FIGS. 4B and 6, after incorporation of the metallic or semi-metallic atoms into the deprotected layer 26, in 52, the modified layer 30 provides etch selectivity to the material that originally composed the trench structure 18. More particularly, silicon and aluminum can both form oxides that become good barriers in some processes. Therefore, an image reversal may be accomplished by, in 48, removing the trench structure 18 using a selective etch process. Once the trench structure 18 is removed, the photoactive film 22 with the top modified layer 30 defines a series of trenches 20' having a 1:3 duty cycle. Alternatively, as shown in FIG. 6, the modified chemical template formed by the trench structure 18 and the modified layer 30 may be used for chemo-epitaxy directed self-assembly (DSA), in 56 and 58, or for selective deposition in 54 (both described below). The pattern formed by the photoactive film 22 may be transferred to the underlying layers (transfer process not shown), in which the modified layer 30 acts as a mask. To that end, the underlying layers may have etch selectivity with modified layer 30. In an embodiment where the modified layer 30 includes silicon, the third layer 16 may be, for example, nitride based, TiN based, or made of organic material.

One of ordinary skill in the art should recognize that the method of forming the chemical template may vary based on the intended use. Modifying the chemical template to form a deprotected layer and incorporating metallic or semi-metallic atoms into the deprotected layer to form the modified chemical template of FIG. 4A may be the most suitable for subsequent selective deposition in 54 of FIG. 6. Further, it should be recognized that the material layer selectively deposited using the modified chemical template may be formed using a variety of techniques. For example, in an embodiment, in 54, the modified chemical template may be used to selectively grow a film. Growth is a type of deposition in which a deposited layer is formed via a reaction between a reactant and a substrate material. Thus, the chemical template may be used to provide different growth rates on the surface so as to allow selective growth from one substrate material relative to another substrate material. In that regard, a material may have an inherent difference in the growth rate on one portion of a substrate compared to another. This process has potential application for changing the surface of one part of a feature array. That substrate could be patterned and filled with the photoactive material as described above in 40, 42. Likewise, a flood exposure could also be completed to even out the over-coated material, again as described above in 44. Where the neutral trench material inherently has growth selectivity compared to the photoactive film material, the chemical template of FIG. 1D may be used to selectively grow a film without creating the deprotected layer and incorporating metallic atoms (not shown). Alternatively, the surface properties of the photoactive film may be changed by using the acid rinse and diffusion bake in 50 and, optionally, the metallic or semi-metallic atom incorporation in 50, 52 to protect this area and allow for the selective growth in 54 off the trench structure 18 of the modified chemical template.

Figure 5A:
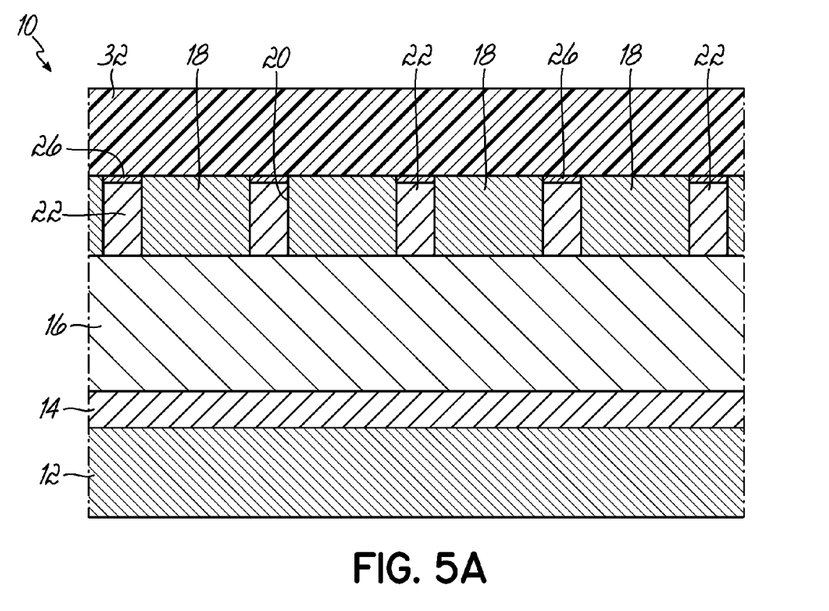
FIGS. 5A and 5B are diagrammatic illustrations depicting a method according to an embodiment for using a chemical template for chemo-epitaxy directed self-assembly.
Figure 5B:
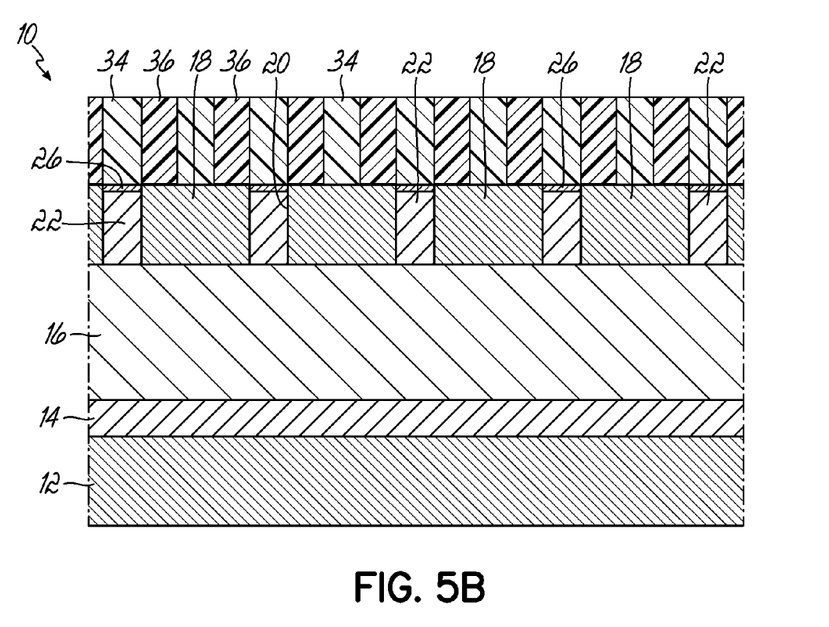

Referring generally to FIGS. 5A, 5B, and 6, in an embodiment of the invention, a method for using a chemical template for DSA is shown. The method of this embodiment begins with the chemical template of FIG. 1D or the modified chemical template of FIG. 3B or 4A. In the example of FIGS. 5A and 5B, the modified chemical template of FIG. 3B was formed on the substrate 10, as in 40, 42, 44, 46, and 50 of FIG. 6. Like reference numerals in FIGS. 5A and 5B are used to refer to like parts in FIGS. 1A-1D, 3A, and 3B. The trench structure 18 and the deprotected layer 26 form the modified chemical template. The trench structure 18 is neutral to both blocks of a lamellar block copolymer intended to be deposited on the chemical template. As shown in FIG. 5A, in 56, the chemical template is coated with a lamellar block copolymer 32, and as shown in FIG. 5B, in 58, directed self-assembly (DSA) is performed. In an embodiment, the block copolymer 32 may be poly(styrene)-block-poly(methyl methacrylate) (PS-b-PMMA). In this case, as shown in FIG. 5B, the deprotected layer 26 of the photoactive film 22 will act to pin a number of the polar PMMA block domains 34 of the block copolymer 32, and the block domains 36 will self-assemble on top of the neutral trench structure 18 between the pinned PMMA block domains 34. The ratio of PMMA block domains 34 that are pinned to the deprotected layer 26 to the total number of PMMA block domains 34 may vary based on the block copolymer composition and/or the duty cycle of the trench structure 18. For example, as shown in FIG. 5B, every other PMMA block domain 34 is pinned to the deprotected layer 26 when the trench structure 18 has a 3:1 duty cycle.

It should be recognized that the creation of the deprotected layer and/or the incorporation of the metallic or semi-metallic atoms are optional steps in creating the chemical template. For example, in an embodiment where the material for the photoactive film 22 itself is pinning, a number of one of the block domains of the block copolymer 32 may be pinned to the photoactive film (not shown). By way of further example, referring again to FIG. 1D, the trench structure 18 and the photoactive film 22 form a chemical template, and the block copolymer 32 may be applied thereto. Every other of the PMMA block domains 34 may then be pinned to the photoactive film 22. Likewise, in another embodiment, where a deprotected layer modified to contain metallic or semi-metallic atoms at the surface of the photoactive film 22 is pinning, the modified layer may be used, and block domains of the block copolymer 32 may be pinned to the modified layer 30 (not shown). By way of further example, referring again to FIGS. 4A and 5B, the trench structure 18 and the modified layer 30 may form a modified chemical template, and the block copolymer 32 may be applied thereto. Every other of the PMMA block domains 34 may then be pinned to the modified layer 30.

In another embodiment (not shown), the method shown in FIGS. 3A and 3B may further include grafting an organic material to the deprotected layer 26 to even further modify the chemical template to create desired differences in the surface chemistry, for example, to improve the etch selectivity or to provide different growth rates. In an embodiment, an organic material is grafted to the deprotected layer 26 such that a modified layer is formed (not shown) that includes exposed hydroxide groups (—OH). The exposed hydroxide groups may be a part of larger functional groups, such as carboxylic acids, phenols, and aliphatic alcohols. The modified layer including the exposed hydroxide groups may provide etch selectivity to the material that originally composed the trench structure 18, enabling image reversal via selective RIE, similar to the method shown in FIGS. 4A-4B. Additionally, the modified chemical template formed by the trench structure 18 and the modified layer including the grafted organic material may be used for selective deposition, as described above, or for chemo-epitaxy directed self-assembly (DSA), similar to the method shown in FIGS. 5A-5B. In an embodiment, a block copolymer may be applied to the chemical template to form a self-assembled monolayer (not shown) in which a block of the copolymer reacts with the exposed hydroxide groups in a cross-esterification process.

While specific embodiments have been described in considerable detail to illustrate the present invention, the description is not intended to restrict or in any way limit the scope of the appended claims to such detail. The various features discussed herein may be used alone or in any combination. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope of the general inventive concept.

What is claimed is:

1. A method for treating a microelectronic substrate to form a chemical template, comprising:
    patterning the substrate to form a trench structure with a plurality of trenches of a defined trench width;
    depositing a photoactive material on the substrate to overfill the trench structure to form a fill portion in the plurality of trenches and an overfill portion above the trench structure;
    exposing the photoactive material to electromagnetic radiation comprising a wavelength that is at least four times greater than the defined trench width such that the overfill portion is modified by the exposure while the electromagnetic radiation fails to penetrate into the plurality of trenches leaving the fill portion unmodified; and
    removing the modified overfill portion of the photoactive material to form a planarized filled trench structure for use as a chemical template for selective reactive ion etching, selective deposition, or directed self-assembly.

2. The method of claim 1, wherein the trench structure comprises a material having etch selectivity to the photoactive material, the method further comprising:
    selectively reactive ion etching the chemical template to remove the trench structure, wherein the fill portion of the photoactive material remains having a pattern image that is the reverse of a pattern image of the trench structure.

3. The method of claim 1, further comprising:
    forming a deprotected layer on the fill portion of the photoactive material to modify the chemical template.

4. The method of claim 3, wherein forming the deprotected layer comprises:
    treating the substrate with an acid; and
    baking the substrate to diffuse the acid into the fill portion to form the deprotected layer.

5. The method of claim 3, wherein the deprotected layer comprises a thickness between 5 nm and 15 nm.

6. The method of claim 3, further comprising:
    selectively reactive ion etching the modified chemical template to remove the trench structure, wherein the fill portion of the photoactive material with the deprotected layer remains having a pattern image that is the reverse of a pattern image of the trench structure.

7. The method of claim 3, further comprising:
    incorporating metallic or semi-metallic atoms into the deprotected layer to further modify the chemical template.

8. The method of claim 7, wherein incorporating the metallic or the semi-metallic atoms comprises treating the substrate with one or more silylation agents to incorporate silicon atoms into the deprotected layer.

9. The method of claim 8, wherein the silylation agents comprise one or more of hexamethyldisilazane (HMDS), trimethylsilyldimethylamine (TMSDMA), dimethylsilyldimethylamine (DMSDMA), dimethyldisilyldimethylamine (DMDSDMA), or bisaminopropyl-oligodimethylsiloxane.

10. The method of claim 7, wherein incorporating the metallic or the semi-metallic atoms comprises treating the substrate with one or more acrylic polymers to incorporate aluminum into the deprotected layer.

11. The method of claim 7, further comprising:
selectively reactive ion etching the further modified chemical template to remove the trench structure, wherein the fill portion of the photoactive material with the deprotected layer containing the metallic or semi-metallic atoms therein remains having a pattern image that is the reverse of a pattern image of the trench structure.

12. The method of claim 7, further comprising:
selectively depositing an overlying layer on the further modified chemical template.

13. The method of claim 12, wherein the overlying layer comprises a material having a first growth rate on the trench structure that is faster than a second growth rate on the deprotected layer containing the metallic or semi-metallic atoms therein.

14. The method of claim 12, wherein the overlying layer comprises a material having a first growth rate on the trench structure that is slower than a second growth rate on the deprotected layer containing the metallic or semi-metallic atoms therein.

15. The method of claim 7, further comprising:
depositing a block copolymer onto the further modified chemical template and performing a directed self-assembly wherein at least a portion of a first block of the block copolymer assembles over the metallic or the semi-metallic atoms and a second block of the block copolymer assembles over the trench structure.

16. The method of claim 15, wherein the block copolymer comprises polystyrene-block-polymethyl methacrylate (PS-b-PMMA).

17. The method of claim 3, further comprising:
depositing a block copolymer onto the modified chemical template and performing a directed self-assembly wherein at least a portion of a first block of the block copolymer assembles over the deprotected layer and a second block of the block copolymer assembles over the trench structure.

18. The method of claim 17, wherein the block copolymer comprises polystyrene-block-polymethyl methacrylate (PS-b-PMMA).

19. The method of claim 3, further comprising:
grafting an organic material to the deprotected layer to further modify the chemical template to provide exposed hydroxide groups on the deprotected layer.

20. The method of claim 19, further comprising:
selectively reactive ion etching the further modified chemical template to remove the trench structure, wherein the fill portion of the photoactive material with the deprotected layer containing the exposed hydroxide groups remains having a pattern image that is the reverse of a pattern image of the trench structure.

21. The method of claim 19, further comprising:
selectively depositing an overlying layer on the further modified chemical template.

22. The method of claim 21, wherein the overlying layer comprises a material having a first growth rate on the trench structure that is faster than a second growth rate on the deprotected layer containing the exposed hydroxide groups.

23. The method of claim 21, wherein the overlying layer comprises a material having a first growth rate on the trench structure that is slower than a second growth rate on the deprotected layer containing the exposed hydroxide groups.

24. The method of claim 19, further comprising:
depositing a block copolymer onto the further modified chemical template and performing a directed self-assembly wherein at least a portion of a first block of the block copolymer assembles over and reacts with the exposed hydroxide groups in a cross-esterification process and a second block of the block copolymer assembles over the trench structure.

25. A method for treating a microelectronic substrate to form a chemical template, comprising:
patterning the substrate to form a trench structure with a plurality of trenches of a defined trench width;
depositing a photoactive material on the substrate to overfill the trench structure to form a fill portion in the plurality of trenches and an overfill portion above the trench structure;
exposing the photoactive material to electromagnetic radiation comprising a wavelength that is at least four times greater than the defined trench width such that the overfill portion is modified by the exposure while the electromagnetic radiation fails to penetrate into the plurality of trenches leaving the fill portion unmodified;
removing the modified overfill portion of the photoactive material to form a planarized filled trench structure;
coating the planarized filled trench structure with an acid;
diffusing the acid into the fill portion to form a deprotected layer on the fill portion of the photoactive material; and
incorporating metallic or semi-metallic atoms into the deprotected layer to form a chemical template for selective reactive ion etching, selective deposition, or directed self-assembly.

26. The method of claim 25, further comprising one of:
selectively reactive ion etching the chemical template to remove the trench structure, wherein the fill portion of the photoactive material remains having a pattern image that is the reverse of a pattern image of the trench structure;
depositing a block copolymer onto the chemical template and performing a directed self-assembly wherein at least a portion of a first block of the block copolymer assembles over the metallic or the semi-metallic atoms and a second block of the block copolymer assembles over the trench structure; or
selectively depositing an overlying layer on the chemical template wherein the overlying layer comprises a material having a different growth rate on the trench structure than on the deprotected layer containing the metallic or semi-metallic atoms.

* * * * *